United States Patent [19]

Corboy, Jr. et al.

[11] Patent Number: 4,592,792
[45] Date of Patent: Jun. 3, 1986

[54] METHOD FOR FORMING UNIFORMLY THICK SELECTIVE EPITAXIAL SILICON

[75] Inventors: John F. Corboy, Jr., East Amwell Township, Hunterdon County; Lubomir L. Jastrzebski, Plainsboro, both of N.J.

[73] Assignee: RCA Corporation, Princeton, N.J.

[21] Appl. No.: 694,100

[22] Filed: Jan. 23, 1985

[51] Int. Cl.$^4$ .................. H01L 21/205; H01L 21/76
[52] U.S. Cl. .................. 148/175; 29/576 E; 29/578; 148/DIG. 25; 148/DIG. 26; 148/DIG. 50; 156/612; 156/613; 156/657; 156/662
[58] Field of Search ....... 148/175, DIG. 25, DIG. 26, 148/DIG. 50; 29/576 E, 578; 156/612, 613, 647, 657, 662

[56] References Cited

U.S. PATENT DOCUMENTS

| | | | |
|---|---|---|---|
| 3,239,372 | 3/1966 | Sirtl ..................................... | 117/201 |
| 3,425,879 | 2/1969 | Shaw et al. .......................... | 148/175 |
| 3,511,702 | 5/1970 | Jackson et al. ................. | 148/175 X |
| 3,661,636 | 5/1972 | Green et al. ................. | 148/DIG. 50 |
| 3,764,409 | 10/1973 | Nomura et al. ....................... | 148/175 |
| 3,850,707 | 11/1974 | Bestland .............................. | 148/175 |
| 3,945,864 | 3/1976 | Goldsmith et al. ................. | 148/175 |
| 4,400,411 | 8/1983 | Yuan et al. ...................... | 156/612 X |
| 4,412,868 | 11/1983 | Brown et al. ......................... | 148/1.5 |
| 4,522,662 | 6/1985 | Bradbury et al. .................. | 148/175 |

OTHER PUBLICATIONS

Druminski et al., "Selective Etching . . . SiH$_4$/HCl/H$_2$" J. Crystal Growth, 31 (1975) pp. 312–316.

Dumin, D. J., "Selective Epitaxy Using Silane and Germane" J. Crystal Growth, 8 (1971), pp. 33–36.
"Effect of Substrate Preparation and Growth Ambient on Silicon Selective Epitaxy", H. M. Liaw et al., Electrochemical Society, CVD IX, Cincinnati, Ohio, 1984.
"Advanced Epitaxial Processes for Monolithic Integrated—Circuit Applications", D. M. Jackson, Jr., Transactions of the Metallurgical Society of AIME, vol. 223, pp. 596–601, Mar. 1965.
"Selective Epitaxy of Silicon Under Quasi-Equilibrium Conditions", E. Sirtl et al., Semiconductor Silicon, R. R. Harberrecht and E. L. Klein, Eds., New York: Electrochemical Society, May 1969, pp. 169–188.
"Advances in Dichlorlsilane Epitaxial Technology," D. J. DeLong, Solid State Technology, Oct. 1972, pp. 29–41.
"The Growth and Etching of Si through Windows in SiO$_2$", W. G. Oldham et al., J. Electrochem. Soc.: Solid State Science, vol. 114, No. 4, Apr. 1967, pp. 381–388.
"Selective Epitaxial Deposition of Silicon", B. D. Joyce et al., Nature, Aug. 4, 1962, pp. 485–486.

Primary Examiner—William G. Saba
Attorney, Agent, or Firm—Birgit E. Morris; Donald S. Cohen; Kenneth R. Glick

[57] ABSTRACT

Monocrystalline silicon is deposited on first and second portions of a substrate, the first and second portions having substantially unequal dimensions. The method comprises subjecting the substrate to a silicon-source gas and a predetermined concentration of chloride at a predetermined temperature. The chloride concentration is selected so as to create a substantially equally thick monocrystalline silicon deposit on each of the substrate portions.

13 Claims, 5 Drawing Figures

METHOD FOR FORMING UNIFORMLY THICK SELECTIVE EPITAXIAL SILICON

The present invention relates to a method for epitaxially depositing monocrystalline silicon on selective portions of a substrate surface. More particularly, the invention relates to a method for forming substantially equally thick monocrystalline silicon deposits within unequally sized apertures in a mask which is disposed on the substrate surface.

BACKGROUND OF THE INVENTION

A selective epitaxial deposition process is one in which monocrystalline material is deposited on predetermined portions of a substrate surface. In the selective epitaxial deposition of silicon, these predetermined portions may conveniently be defined by apertures in a mask which is disposed on the surface. For example, in a conventional process, a layer of masking material such as silicon dioxide is formed on a surface of a monocrystalline silicon substrate, apertures are formed in the mask, and monocrystalline silicon is deposited within the apertures. Further examples of selective epitaxial silicon deposition can be found in U.S. Pat. No. 3,425,879, METHOD OF MAKING SHAPED EPITAXIAL DEPOSITS, D. W. Shaw et al., Feb. 4, 1969; and in SELECTIVE EPITAXIAL DEPOSITION OF SILICON, B. D. Joyce et al., Nature, Aug. 4, 1962, pp. 485–486.

In commonly assigned U.S. patent application Ser. No. 608,544, METHOD FOR GROWING MONOCRYSTALLINE SILICON THROUGH A MASK LAYER, J. F. Corboy Jr. et al., filed May 10, 1984, now U.S. Pat. No. 4,578,142 a two stage selective epitaxial deposition process is described. Basically, this process comprises providing a substrate having an apertured mask thereon and subjecting the substrate to a two stage deposition cycle. In the first stage, silicon is deposited from a silicon-source gas. In the second stage, performed in situ, a portion of the deposited silicon is etched by subjecting the substrate to a silicon-etching gas. Using this process it is possible to form monocrystalline silicon islands within the mask apertures without forming silicon on the exposed surface of the mask layer. The patent application further indicates that a silicon-etching gas such as HCl may be included during the deposition stage of the cycle. It is disclosed that the silicon-etching gas present during the deposition stage influences the vertical growth rate, the horizontal-to-vertical growth rate ratio, and the likelihood of non-monocrystalline silicon forming on the mask during the deposition stage. However, a problem has been observed when using selective epitaxial deposition processes such as the above two stage process to form monocrystalline silicon deposits within apertures having significantly different geometries. In conventional processes the monocrystalline silicon islands formed in the relatively small apertures are of different thickness from the islands formed in the relatively large apertures.

SUMMARY OF THE INVENTION

Monocrystalline silicon is deposited on first and second portions of a substrate, the first and second portions having substantially unequal dimensions. The method comprises subjecting the substrate to a silicon-source gas and a predetermined concentration of chloride at a predetermined temperature. The chloride concentration is determined so as to create a monocrystalline silicon deposit which is of substantially similar thickness on each of the substrate portions.

DETAILED DESCRIPTION OF PREFERRED EMBODIMENT

Figure 1:
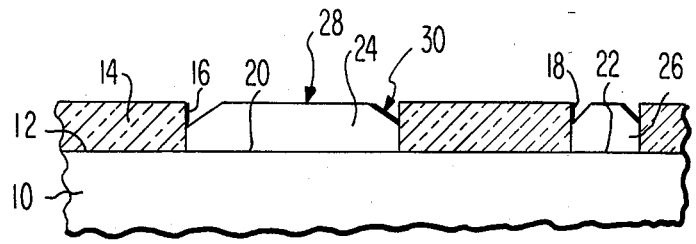
FIG. 1 is a sectional view of a representative structure fabricated in accordance with the present invention.

As illustrated in FIG. 1, a substrate 10 having a substantially planar surface 12 is provided. In the preferred embodiment the substrate material is monocrystalline silicon and the surface 12 is coplanar with a major crystallographic plane. Alternatively, the substrate 10 might comprise, for example, a layer of monocrystalline silicon on an insulating substrate such as sapphire. An apertured mask 14, which in the preferred embodiment comprises a silicon dioxide ($SiO_2$) layer of approximately 0.1 to 1.0 microns in thickness, is disposed on the substrate surface 12. The $SiO_2$ mask 14 can readily be formed and apertures can readily be generated therein by conventional photolithographic processing. However, it should be recognized that the present invention is not limited to the use of $SiO_2$, nor is it limited to a mask of a particular thickness. The important physical characteristics of the mask 14 are that it be non-single-crystalline and that it be capable of withstanding the temperatures encountered during subsequent processing. Other suitable mask materials include, for example, silicon nitride ($Si_3N_4$) and aluminum oxide ($Al_2O_3$).

As illustrated in FIG. 1, the mask 14 includes a relatively large first aperture 16 and a relatively small second aperture 18 which expose, respectively, first and second nucleation sites 20 and 22 on the substrate surface 12. Preferably the apertures have substantially vertical walls, i.e., walls which are perpendicular to the surface 12. When the apertures are rectangular in shape, the minimum length of a side of the relatively large aperture will be approximately 10 times the length of the longest side of the relatively small aperture. It should be recognized, however, that this is merely an approximation and that the method of the invention is suitable for apertures of unequal dimensions generally.

The apertured mask 14 may be made by conventional processing techniques such as, for example, forming an $SiO_2$ layer on the substrate 10 and photolithographically defining and etching the apertures 16 and 18. Furthermore, it should be recognized that although two distinct apertures 16 and 18 are illustrated in FIG. 1, the apertures 16 and 18 may alternatively represent relatively large and relatively small portions of a single aperture.

As described in Ser. No. 608,544, now U.S. Pat. No. 4,578,142, the masked substrate is subjected to a two stage silicon depostion/etching cycle. In the first stage, hereinafter the deposition stage, silicon is deposited from a gas mixture which includes, at a minimum, a silicon-source gas and a source of chloride such as hydrogen chloride (HCl). In the preferred embodiment the silicon-source gas is dichlorosilane ($SiH_2Cl_2$), although silane ($SiH_4$), trichlorosilane ($SiHCl_3$), or silicon tetrachloride ($SiCl_4$) could alternatively be used. Typically, a carrier gas such as hydrogen ($H_2$) will also be present. In the second stage, hereinafter the etching stage, a portion of the silicon deposited during the first stage is etched in a silicon-etching gas. Typically the silicon-etching gas used in the etching stage is also HCl and a carrier gas is also present. The deposition/etching cycle is then typically repeated a predetermined number of times so as to form a monocrystalline silicon island of a particular thickness within each aperture in the mask 14. The monocrystalline silicon islands formed within the first and second apertures 16 and 18 are indicated at 24 and 26 respectively in FIG. 1.

A preferred set of deposition parameters is as follows:

|  | Flow Rate (liters/min) | | | |
| --- | --- | --- | --- | --- |
|  | $H_2$ | HCl | $SiH_2Cl_2$ | Duration (sec) |
| Deposition stage | 160 | 1.3 | 0.75 | 12 |
| Etching stage | 160 | 1.3 | 0 | 30 |
| Reactor temperature: | 1100° C. (pyrometer reading) | | | |
| Pressure: | 50 Torr | | | |

It is characteristic of the described selective epitaxial growth process that the thickness of the silicon island within each aperture is not uniform within a particular aperture. More specifically, each of the silicon islands can be characterized by a thickness at its center 28 and a thickness at its edge 30 (adjacent to the wall of the aperture). In the structures fabricated by the method of the invention the center thickness of each island is optimumly equal to the thickness of the mask 14.

In trying to achieve the same center thickness 28 in both a relatively large silicon island 24 and a relatively small silicon island 26, we have discovered that there is a strong dependence on the chloride concentration during the deposition stage. It is apparent that a source of chloride, in addition to any which may be inherent in the silicon-source gas molecules, is necessary. The ratio of the chloride concentration to the Si concentration during the deposition stage is critical to thickness uniformity. This concentration ratio is determined by the specific silicon-source gas used and by the relative flow rates of the source of chloride and the silicon-source gas. When a silicon-source gas which includes chlorine is used, for example $SiH_2Cl_2$, $SiHCl_3$ or $SiCl_4$, it will influence the amount of additional chloride which must be added. In the cited example, this critical chloride to silicon concentration ratio is determined by the ratio between the HCl flow rate and the $SiH_2Cl_2$ flow rate, i.e., 1.3:0.75. For species of silicon-source gas other than $SiH_2Cl_2$ the optimum flow rates of the silicon-source gas and the additional chloride source can be empirically determined.

Figure 2:
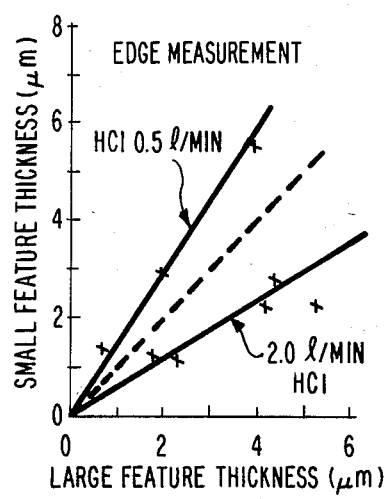
FIGS. 2–5 are graphical representations of data which support the method of the present invention.
Figure 3:
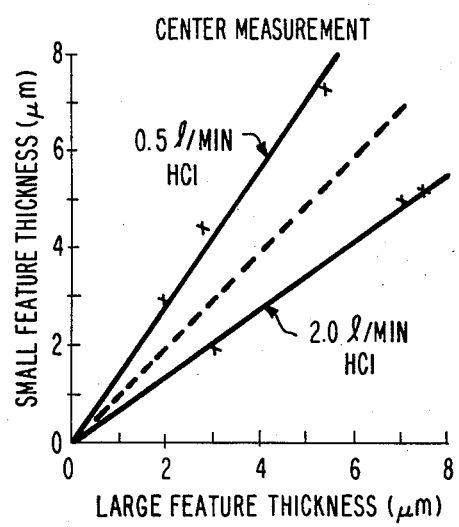
Figure 4:
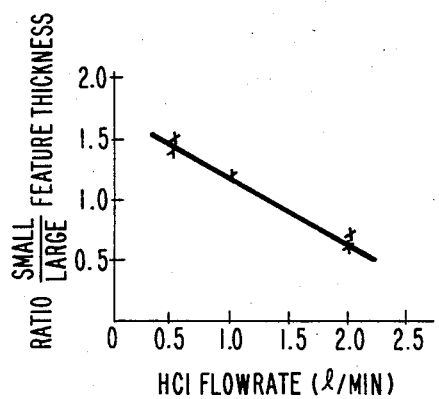

Using $SiH_2Cl_2$ as the silicon-source gas at a flow rate of 0.75 liters/minute, an $H_2$ carrier gas at a flow rate of 160 liters/minute, a reactor temperature of 1100° C. and a pressure of 50 Torr, the data of FIGS. 2-4 was generated.

FIG. 2 represents edge thickness 30 data and FIG. 3 represents center thickness 28 data. As the graphs illustrate, for both edge and center measurements the thickness of both small and large features is strongly dependent on the HCl concentration during the deposition stage. In both FIGS. 2 and 3 the dashed line does not represent data but rather represents an HCl concentration at which the thickness of a small island is equal to the thickness of a large island, i.e., a ratio of 1:1.

As illustrated in FIG. 4, the optimum 1:1 ratio of small feature thickness to large feature thickness occurs with an HCl flow rate of approximately 1.3 liters/minute during the deposition stage. A useable range of HCl flow rates is 0.5 to 2.0 liters/minute if a thickness ratio of 0.6 to 1.5 can be tolerated in the resulting structure. This 0.5 to 2.0 liter/minute HCl flow rate corresponds to a 0.67 to 2.67 ratio of HCl concentration to $SiH_2Cl_2$ concentration in the cited deposition/etching cycle, where the $SiH_2Cl_2$ flow rate is 0.75 liters/minute.

Figure 5:
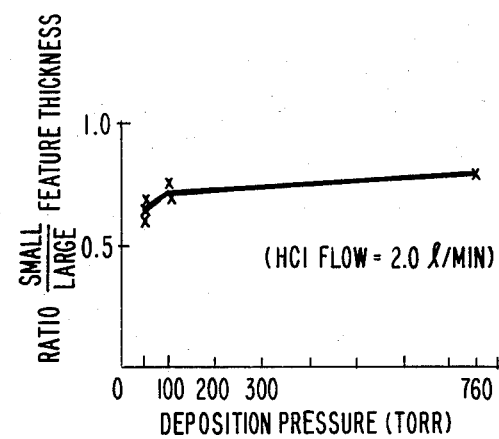

The data of FIG. 5 illustrates that for an HCl flow rate of 2.0 liters/minute, the small to large feature thickness ratio is dependent upon deposition pressure. It is expected that for the previously indicated optimum HCl flow rate of approximately 1.3 liters/minute, a similar curve would exist, although shifted upward along the ordinate.

Given the method of this invention, one can achieve relatively uniform monocrystalline silicon island thickness for other deposition/etching cycle conditions as well. That is, now that a relationship between thickness uniformity and HCl concentration has been discovered, an optimum HCl or other chloride concentration can be determined for a particular silicon-source gas at a variety of deposition/etching conditions. For example, the method of this invention is suitable to depositions at other pressures, temperatures, flow rates and silicon-source gas concentrations.

What is claimed is:

1. In a method for depositing monocrystalline silicon on first and second selective portions of a substrate defined by a mask, said first portion having substantially unequal dimensions from said second portion, said method comprising subjecting said substrate to a silicon-source gas and chloride source at a predetermined temperature, the improvement comprising:
   exposing said substrate to a predetermined concentration of chloride during said depositing, said chloride concentration being selected so as to create a monocrystalline silicon deposit on each of said portions, the thickness of each of said deposits being substantially equal.

2. A method in accordance with claim 1 comprising providing HCl as a source of said chloride.

3. A method in accordance with claim 1 further comprising exposing said substrate to a carrier gas during said depositing.

4. A method in accordance with claim 3 wherein said carrier gas is hydrogen.

5. A method in accordance with claim 1 wherein said silicon-source gas is selected from the group consisting of dichlorosilane, silane, silicon tetrachloride and trichlorosilane.

6. A method in accordance with claim 1 wherein said depositing is performed at a pressure equal to or less than 760 Torr.

7. A method in accordance with claim 1 wherein said depositing is performed at 50 Torr.

8. A method in accordance with claim 1 further comprising exposing said silicon deposits to a silicon-etching gas following said exposure to silicon-source gas and chloride.

9. A method in accordance with claim 8 comprising providing HCl as a source of said chloride.

10. A method in accordance with claim 9 wherein said exposure to silicon-source gas and HCl is for approximately 12 seconds and said exposure to the silicon-etching gas is for approximately 30 seconds.

11. A method in accordance with claim 2 wherein said silicon-source gas is dichlorosilane and the volume ratio of HCl to dichlorosilane is in the range of approximately 0.67 to 2.67.

12. A method in accordance with claim 11 wherein said depositing further comprises a hydrogen flow rate of 160 liters/minute, an HCl flow rate of approximately 1.3 liters/minute and a dichlorosilane flow rate of approximately 0.75 liters/minute.

13. A method in accordance with claim 1 further comprising defining said first and second selective portions with a silicon dioxide mask.

* * * * *